United States Patent [19]

Cacheux

[11] 4,191,593
[45] Mar. 4, 1980

[54] DOUBLE HETEROJUNCTION SOLAR CELLS

[75] Inventor: Jean A. Cacheux, Castanet-Tolosan, France

[73] Assignee: Centre National d'Etudes Spatiales, Paris, France

[21] Appl. No.: 946,084

[22] Filed: Sep. 26, 1978

[30] Foreign Application Priority Data

Sep. 27, 1977 [FR] France ................. 77 28984

[51] Int. Cl.² ............................................ H01L 31/06
[52] U.S. Cl. ........................... 136/89 CA; 136/89 PC; 136/89 GA; 357/16; 357/30; 357/81
[58] Field of Search .......... 136/89 SJ, 89 GA, 89 PC, 136/89 CA, 89 MS; 357/16, 30, 81

[56] References Cited

U.S. PATENT DOCUMENTS

| 2,640,901 | 6/1953 | Kinman | 201/63 |
| 3,229,682 | 1/1966 | Perlmutter et al. | 126/270 |
| 3,780,722 | 12/1973 | Swet | 126/270 |
| 4,069,812 | 1/1978 | O'Neill | 126/271 |
| 4,128,733 | 12/1978 | Fraas et al | 136/89 SJ |

*Primary Examiner*—Aaron Weisstuch
*Attorney, Agent, or Firm*—Abraham A. Saffitz

[57] ABSTRACT

Photovoltaic cell comprising two heterojunctions between three component semiconductors $Ga_{1-x}AL_x$ As with x varying from 0 to 0.9, GaAs, and Ge which have respective bandgaps of 0.66, 1.43 and 2.4 eV, lattice constants matching at 0.07% and expansion coefficients matching at 1.7%. The cell is mounted in a cell device comprising a parallelepipedal unit, a Fresnel lens, a tapering cavity within said unit, partially filled up with a lens shaped antireflecting transparent material and a radiator, said device forming a sunlight concentrator.

2 Claims, 6 Drawing Figures

DOUBLE HETEROJUNCTION SOLAR CELLS

BACKGROUND OF THE INVENTION

1. Field of the Invention

This invention concerns a solar cell and more especially a double-heterojunction solar cell in which photons of the solar spectrum are selectively absorbed in one or the other of the heterojunctions depending on their energy. Spectral response and solar cell efficiency are in this way increased.

The invention also concerns a solar cell mounting device improving the concentration of solar rays and the cell reflectivity.

FIG. 1 represents the energy band diagram of a typical heterojunction between two monocrystalline materials. Light of energy less than $E_{g1}$ (bandgap energy of the first material which has the larger bandgap) but greater than $E_{g2}$ (bandgap energy of the second material which has the smaller bandgap) passes through the first material which acts as a "window" and is absorbed by the second one, and carriers created within the depletion region and within a diffusion length from the junction edges are collected exactly as in a p-n homojuntion cell. Light of energy greater than $E_{g1}$ is absorbed in the first material and carriers created within a diffusion length from the junction edges and within the depletion region of this material are also collected. The advantage provided by a heterojunction over the majority of normal p-n junctions lies in their short wavelength response. If $E_{g1}$ is large, the high-energy photons are absorbed inside the depletion region of the second material where the carrier collection is very efficient. If the first material is also thick in addition to presenting a broad bandgap, the cell has a lower series resistance and a higher radiation tolerance than a p-n junction made entirely from the second material.

In a homojunction, the barrier height is:

$$V_d = E_g - (E_C - E_F) - (E_F - E_V) \quad (1)$$

where $E_C$, $E_V$ and $E_F$ are the conduction band energy, the valence band energy and the Fermi level in the n- and p-sides of the junction respectively.

In a heterojunction, the barrier height in an n-p cell is given by:

$$V_d = E_{g2} + \Delta E_C - (E_C - E_F) - (E_F - E_V) \quad (2)$$

and in a p-n cell by:

$$V_d = E_{g2} + \Delta E_V - (E_C - E_F) - (E_F - E_V) \quad (3)$$

where $E_{g2}$ is the bandgap energy of the material with a small bandgap. The $E_C$ and $E_V$ discontinuities are given by:

$$\Delta E_C = \chi_2 - \chi_1$$
$$\Delta E_V = E_{g1} - E_{g2} - (\chi_2 - \chi_1) \quad (4)$$

where $\chi_1$ and $\chi_2$ are the electron affinities of the two materials.

It follows from equations (2) and (3) that the barrier potential $V_d$ of an n-p or p-n heterojunction can be greater than in a homojunction by an amount equal to discontinuity energies $\Delta E_C$ or $\Delta E_V$ if these quantities are positive. In fact, $\Delta E_C$ and $\Delta E_V$ can be either positive or negative as indicated by equations (4). However, the output power from a heterojunction is no greater than that obtained from a homojunction made in the low bandgap-energy material alone since a high barrier potential $V_d$ is accompanied by a reduced photocurrent. The advantages of a heterojunction do not lie in an increased power output but rather in the elimination of surface recombination and dead-layer problems, the reduction in the series resistance and the increase in radiation tolerance.

2. Description of the Prior Art

U.S. patent application Ser. No. 553,850 filed Feb. 27, 1975 now U.S. Pat. No. 4,017,332, in the name of Lawrence W. JAMES has disclosed a photovoltaic cell comprising (i) a first epitaxial layer of semiconductive material comprising a first given combination of elements selected from columns IIIA and VA of the Periodic Table, a portion of said layer, starting from the bottom surface thereof, having a given conductivity type, the remaining portion of said layer comprising the portion of said layer adjacent the upper surface thereof, having a conductivity type opposite to said given type and such that a rectifying p-n junction is formed in said layer parallel to the upper and lower surfaces thereof, said layer having a given bandgap within the range of 0.4 to 2.3 eV and a given lattice constant within the range of 5.4 to 6.1 Angstrom units; (ii) a second epitaxial layer of semiconductive material joined to the upper surface of said first epitaxial layer and comprising a second given combination of elements selected from columns IIIA and VA of the periodic table, said layer having the said opposite conductivity type, said layer having a given bandgap within the range of 0.4 to 2.3 eV, said layer having substantially the same lattice constant as that of said first epitaxial layer, said second epitaxial layer being joined to the upper surface of said first epitaxial layer so as to form a first heterojunction of like conductivity with the upper portion of said first epitaxial layer; and (iii) a third epitaxial layer of semiconductive material comprising a third given combination of elements selected from columns IIIA and VA of the Periodic Table, a bottom portion of said layer, starting from the bottom surface thereof, having the said given conductivity type, the remaining portion of said layer having said opposite conductivity type and such that a rectifying p-n junction is formed at said layer parallel to the upper and lower surfaces thereof, said layer having a given bandgap within the range of 0.4 to 2.3 eV and higher than the bandgap of said first epitaxial layer, said third epitaxial layer being joined to the upper surface of said second epitaxial layer so as to form a second heterojunction of opposite conductivity with said second epitaxial layer, said second and third epitaxial layers thus providing an n-p junction, said third epitaxial layer comprising means providing a substantial short circuit with said second epitaxial layer in the direction of easy current flow across said p-n junction in said first epitaxial layer and opposite to the direction of easy current flow across the n-p heterojunction formed by said second and third epitaxial layers.

In this patent application, the heterojunctions are made of IIIA-VA compound semiconductors. For example, designating by a the lattice constant, a typical heterojunction is the following:

$$a_{InGaAs} = 5.86 \, A$$
$$a_{GaAs} = 5.66 \, A$$
$$\Delta a = a_{InGaAs} - a_{GaAs} = 0.2 \, A$$

which gives a lattice mismatch $\Delta a/a$ of 3.4%. This is a rather great value and as it is known (see "Semiconductor Lasers and Heterojunction LEDs" by Henry KRESSEL and J. K. BUTLER, Academic Press, 1977, page 300) a lattice mismatch greater than about 2% commonly results in uneven nucleation on the substrate and polycrystalline growth.

The distance between dislocations is:

$$L_d = a^2/\Delta a = (5.86)^2/0.2 = 170 \text{ Å}$$

The number of dangling bonds per $cm^2$ is proportional to the reciprocal of the dislocation distance squared $$1/(0.017 \times 10^{-4})^2 = 3.4 \times 10^{11} \text{ cm}^{-2}$$

This a low value with respect to $10^8$, the number of valence bonds of a perfectly matched cubic structure crystal.

The aforementioned James patent fails to consider the mismatch between the expansion coefficients of the compound semiconductors forming the heterojunctions.

One of the most successful experimental heterojunction cells of recent years is the $pGa_{1-x}Al_xAs\text{-}nGa\text{ }As$ structure described in the book "Semiconductors and Semimetals", Volume II "Solar Cells" by Harold J. Hovel, Academic Press, 1975, pages 138 and 196. This structure is improved by adding a layer of pGaAs between the two semiconductor materials to form the $pGa_{1-x}Al_xAs\text{-}pGaAs\text{-}nGaAs$ structure which makes it possible to collect carriers over a greater distance compared to the pure heterojunction. FIG. 80 in the aforementioned publication shows the energy efficiency of this structure in AMO (no atmosphere) and in AMI (at the Earth's surface) as a function of the depth of the pGaAs layer.

SUMMARY OF THE INVENTION

The double heterojunction solar cell of the invention uses as its first heterojunction the heterojunction $$pGa_{1-x}Al_xAs - nGaAs$$

which has just been recalled and the fabrication of which is described on page 195 of the reference publication of Hovel. This junction absorbs photons between $E_{g1} = 2.14$ eV and $E_{g2} = 1.43$ eV. The second heterojunction is, in compliance with the invention, a Ge-GaAs one which absorbs electrons between $E_{g2} = 1.43$ eV and $E_{g3} = 0.66$ eV.

The lattice constants of the heterojunction Ge-GaAs are:

$$a_{GaAs} = 5.6535 \text{ A}$$
$$a_{Ge} = 5.6575 \text{ A}$$
$$\Delta a = a_{Ge} - a_{GaAs} = 0.004 \text{ A}$$

which give a lattice mismatch $\Delta a/a$ of 0.07%.

The distance between dislocation is:
$$L_d = a^2/\Delta a \simeq 0.8 \text{ μm}$$

The number of dangling bonds per $cm^2$ is proportional to the reciprocal of the dislocation distance squared $$1/(0.8 \times 10^{-4})^2 \simeq 1.5 \times 10^8 \text{ cm}^{-2}$$

The dangling bond number is at least 2000 times less in the epitaxial heterojunction used in the invention than in the prior art.

Although the number of dislocations have been calculated ignoring the plastic deformation of the substrate, the difference between the dangling bonds and therefore the difference of the photocurrents in the solar cells of the prior art and in the solar cells of the invention remains quite important even if elastical strain in the layers is considered. Instead of $1.5 \times 10^8$ and $3.4 \times 10^{11}$, one finds respectively $2.4 \times 10^{14}$ and $1.3 \times 10^{16}$.

The expansion coefficient of the germanium is $5.8 \times 10^{-6}$ and the expansion coefficient of GaAs is $5.9 \times 10^{-6}$, e.g. the expansion coefficient difference is smaller than 2%. In the James patent referred to above, the minimal expansion coefficient difference is larger than 10%, for example in the heterojunction InAs-GaAs. Since the solar cells are designed to operate under widely variable weather and irradiance conditions, a good matching of the expansion coefficient of the compound semiconductors of the heterojunctions decreases the number of dislocations and increases the photocurrent.

BRIEF DESCRIPTION OF THE DRAWINGS

The invention is now going to be described in detail with reference being made to the hereto appendixed diagrams in which:

FIG. 1 shows bands and band energies in terms of the explinations given in the introductory part. It indicates the values of $E_{g1}$, $E_{g2}$ and $E_{g3}$ which are the bandgap energies for GaAlAS, GaAs and Ge respectively, the conduction—and valence—band energy discontinuity values $\Delta E_C$ and $\Delta E_V$ for the heterojunction GaAs-Ge and the electronic affinity values $x_1$, $x_2$ and $x_3$ for GaAlAs, GaAs and Ge respectively.

Referring to FIG. 2, we have shown the solar spectrum expressed in number of photons per $cm^2$ per second in a band width of 1 eV in terms of the wavelength expressed in electron-volts and the bandgap energies for GaAs, $E_{g(GaAs)} = 1.43$ eV and AlAs, $E_{g(AlAs)} = 2.14$ eV have been marked on the energy axis. The spectrum energy absorbed by the first heterojunction is the area of the spectral curve lying between 1.43 and 2.14 eV; it is equal to $2.55 \times 10^{17}$ eV.

Figure 1:
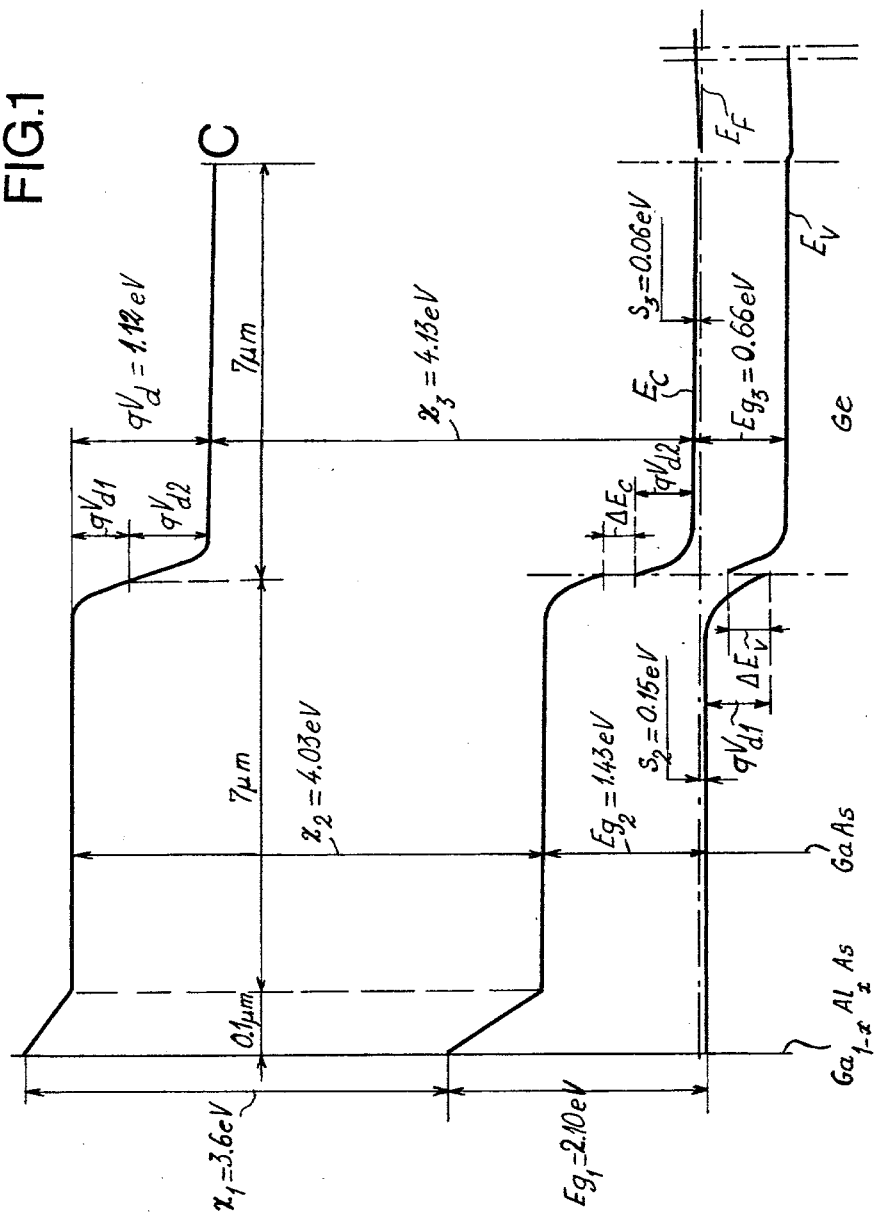
FIG. 1 is a diagram showing the energy bands and the energy-band discontinuities for the GaAlAs-AlAs and Ge-GaAs heterojunctions.
Figure 2:
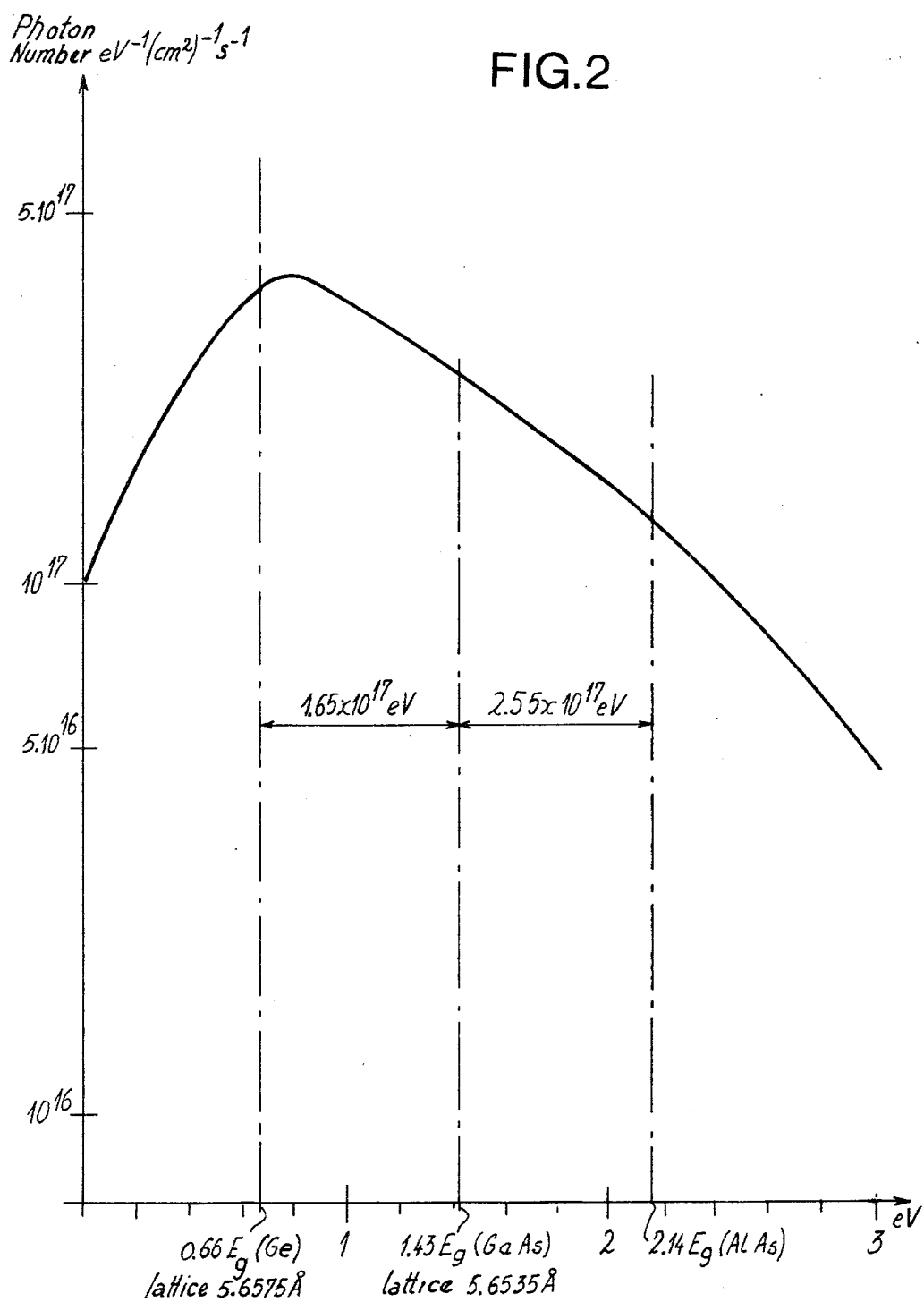
FIG. 2 represents the solar spectrum and the photons absorbed by each of the heterojunctions.
Figure 3:
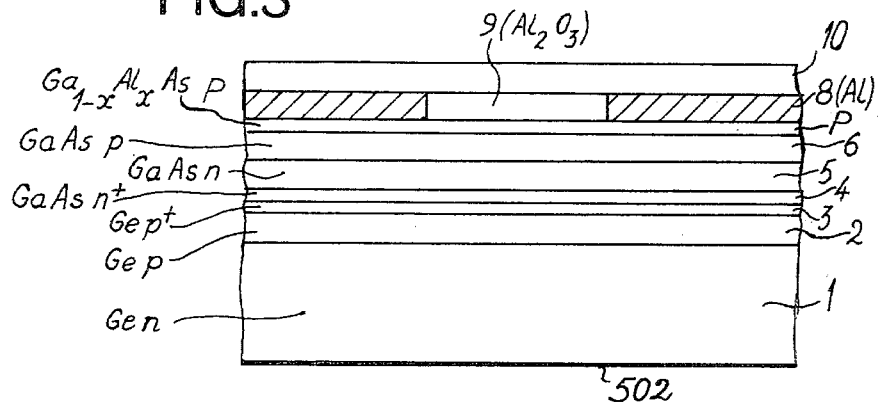
FIG. 3 represents a first double-heterojunction solar cell in accordance with the invention.

In accordance with the invention, the second heterojunction is an GaAS-Ge one. The bandgap energy of Ge is $E_{g(Ge)} = 0.66$ eV. The spectrum energy absorbed by the second heterojunction is then equal to $1.65 \times 10^{17}$ eV, i.e. a total of $4.20 \times 10^{17}$ eV for the two heterojunctions.

Ge and GaAs have crystallographic lattice dimensions of 5.6575 and 5.6535 Å respectively and consequently provide, in this respect, a good matching equal to $40/56555 \simeq 7/10000$. Their expansion coefficients are $5.8 \times 10^{-6}$ and $5.9 \times 10^{-6}$ respectively, i.e., a relative difference of 1.7%. The Ge-GaAs heterojunction can therefore be made with no difficulty and it withstands high temperatures without dislocation. The epitaxial deposition of GaAsP and GaAs on Ge is disclosed in the article "Epitaxial Deposition of GaAsP on Ge substrates" by H. JÄGER and E. SEIPP published in J. Appl. Phys. 49 (6) June 1978, pages 3217 and 3323.

DESCRIPTION OF THE PREFERRED EMBODIMENTS

We now describe two examples of double-heterojunction solar cells with adjacent absorption bands:

EXAMPLE 1

The initial wafer is p-type Ge with a thickness of 400 $\mu$m having a dopant concentration of $6 \times 10^{15}$ cm$^{-3}$ and a resistivity of 0.5 ohm-cm. The the following layers are then provided by vapor or liquid phase epitaxial techniques:

layer 1 of n-type Ge doped with lithium with a depth of about 400 $\mu$m (more precisely, 400 $\mu$m less the depth of layer 2), having a dopant concentration of $10^{18}$ cm$^{-3}$ and a resistivity of $10^{-3}$ ohm-cm;

layer 2 of p-type Ge with a depth of 7 $\mu$m which is actually an unmodified part of the initial wafer;

layer 3 of p$^+$-type Ge doped with gallium with a depth of 500 Å, having a dopant concentration of $10^{20}$ cm$^{-3}$ and a resistivity of $6 \times 10^{-4}$ ohm-cm;

layer 4 of n$^+$-type GaAs doped with tin with a depth of 500 Å, having a dopant concentration of $10^{19}$ cm$^{-3}$ and a resistivity of $3 \times 10^{-4}$ ohm-cm;

layer 5 of n-type GaAs doped with tin with a depth of 5 to 7 $\mu$m having a dopant concentration of $6 \times 10^{17}$ cm$^{-3}$ and a resistivity of $3.5 \times 10^{-3}$ ohm-cm;

layer 6 of p-type GaAs with a depth of 0.3 to 0.5 $\mu$m, having a dopant concentration of $2 \times 10^{19}$ cm$^{-3}$; and layer 7 of p-type Ga$_{1-x}$Al$_x$As doped with zinc with a depth of 500 to 2000 Å, having a dopant concentration of $2 \times 10^{19}$ cm$^{-3}$ and a resistivity of $5 \times 10^{-3}$ ohm-cm. The composition of this layer varies from x=0 at the junction with pGaAs to x=0.85 to 0.9 at the outer surface.

It should be noted that layers 5, 6 and 7 form a pGa$_{1-x}$Al$_x$As-pGaAs-nGaAs type solar cell as was discussed at the outset. These cells are fabricated by liquid phase epitaxy (LPE) by bringing a melt consisting of Ga, Al, Zn and GaAs into contact with an n-type GaAs substrate and leaving it to cool for a few degrees starting from 900° C. at a cooling rate of 0.1 to 0.5° C. per minute. During this reaction, the zinc diffuses into the GaAs substrate and forms a p-n junction.

The cell is coated with a contact 8 of aluminum having windows 9 of aluminum oxide of a depth of 2500 Å. The contact and the windows are coated with a polymer antireflecting layer 10 (polycarbonate or methacrylate). The indices of layers 7, 9 and 10 are $n_1 = 1.4$, $n_2 = 1.7$ and $n_3 = 3.2$ respectively. These layers form an antireflecting two-layer system between the ambient air and the nearest semiconductor to the surface. The minimum reflectivity is given, as is known, by:

$$R = [(n_1^2 n_3 - n_2^2 n_0)/(n_1^2 n_3 + n_2^2 n_0)]^2 \text{ with } n_0 = 1$$

This results in a minimum reflectivity of 8%.

The cell in example 1 is equivalent to two photodiodes in series, in opposition with a tunnel diode, formed by the p$^+$Ge-n$^+$GaAs junction. The output current is the smaller of the two currents $I_{Ge}$ and $I_{GaAs}$ which are both of the order of 25 mA. The output voltage is:

$$V_{Ge} + V_{GaAs} - V_{tunnel} = (0.4 + 1 - 0.05) \text{ volts} = 1.35 \text{ V}.$$

The output power per cm$^2$ is:

$$P = 1.35 \times 25 \times 10^{-3} \simeq 34 \text{ mW/cm}^2.$$

EXAMPLE II

The initial wafer is in n-type Ge with a thickness of 400 $\mu$m having a resistivity of 0.3 to 0.5 ohm-cm and a diffusion length. Lp=10 $\mu$m. The following layers are then provided diffusion or epitaxy:

layer 11 of n$^+$-type Ge doped with lithium with a depth of about 400 $\mu$m (more precisely, 400 $\mu$m less the depth of layer 12), having a resistivity of $10^{-3}$ ohm-cm;

layer 12 of n-type Ge with a depth of 7 $\mu$m which is actually an unmodified part of the initial wafer;

layer 13 of p-type GaAs with a depth of 4 to 7 $\mu$m, having a dopant concentration of $2 \times 10^{19}$ cm$^{-3}$ and a diffusion length $L_p = 5$ $\mu$m; and layer 14 of p-type Ga$_{1-x}$Al$_x$As doped with zinc with a depth of 500 to 2000 Å, having a dopant concentration of $2 \times 10^{19}$ cm$^{-3}$ and a resistivity of $5 \times 10^{-3}$ ohm-cm for x varying from 0 to 0.85–0.9.

The cell is coated with a contact 15 of aluminum having windows 16 of aluminum oxide of a depth of 2500 Å.

The cell in example II is equivalent to two photodiodes in parallel. The output current is the sum of the two currents $I_{Ge}$ and $I_{GaAs}$ which are both approximately 25 mA. The output voltage is the greater of the two voltages $V_{Ge}$ and $V_{GaAs}$, i.e. 1 volt. The output power per cm$^2$ is:

$$P = (2 \times 25 \times 10^{-3}) \times 1 \simeq 50 \text{ mW/cm}^2$$

In the two above examples, the specific dopants for each layer have been described. It goes without saying that a dopant can be replaced by any other dopant of the same physical properties.

Figure 4:
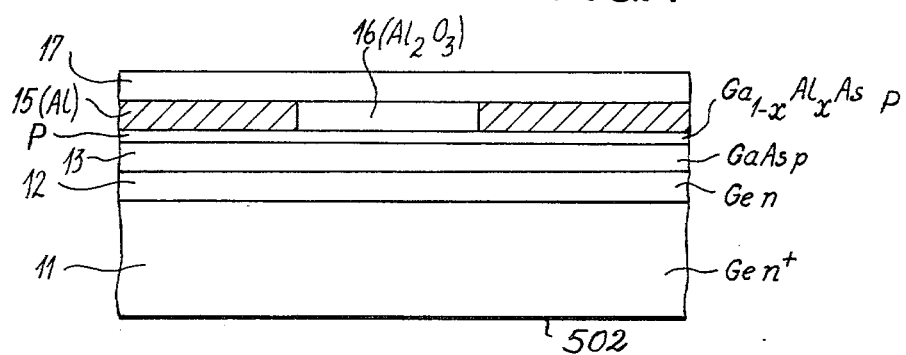
FIG. 4 represents a second double-heterojunction solar cell in accordance with the invention.
Figure 5:
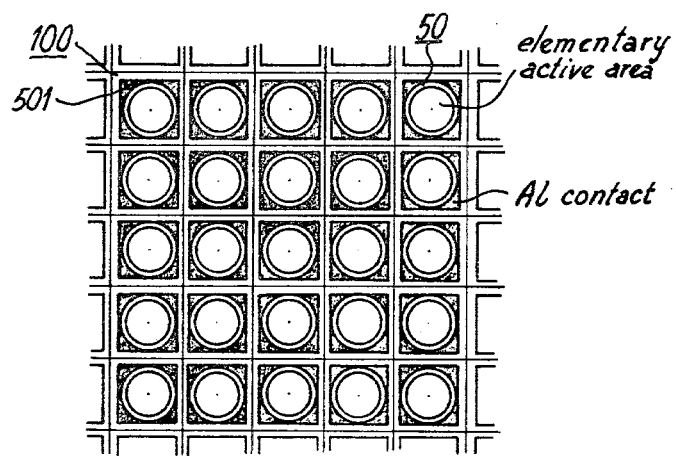
FIGS. 5 and 6 represent in diagrammatic form a solar cell device in accordance with the invention.
Figure 6:
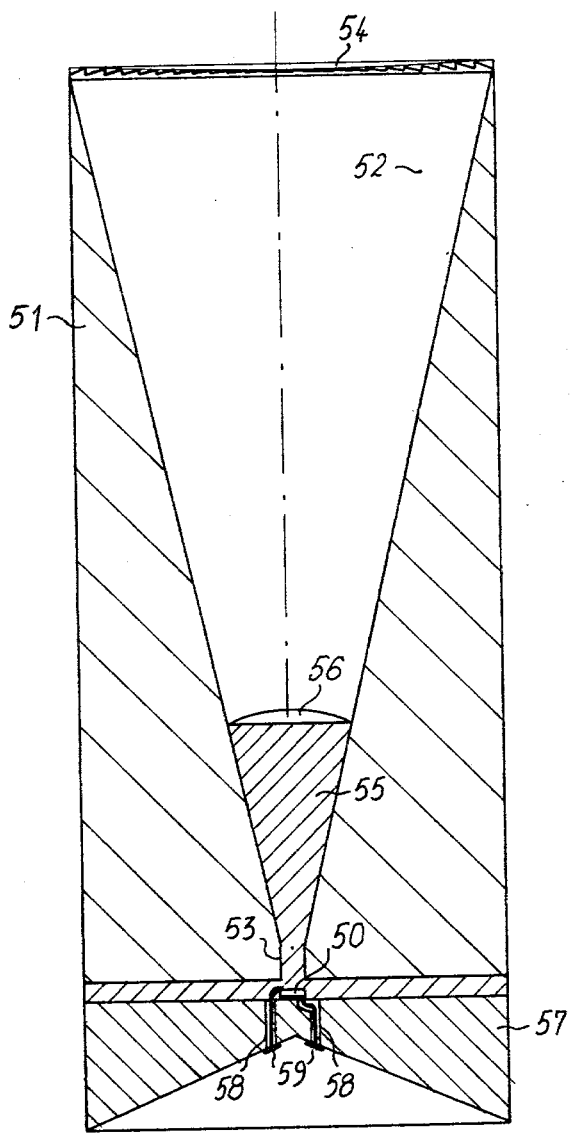

Referring now to FIGS. 5 and 6, we have shown double-heterojunction multilayer wafer 100 after coating with contacts 8 and windows 9 but before the application of antireflection layer 10. The wafer is divided up into 50 elemental cells and connections with the front contacts 501 and rear contacts 502 (see FIG. 4) put in place. In a typical arrangement, as shown in FIG. 5, the elementary cell is a 1×1 mm square and the window is a circle with a diameter of 0.9 mm and a surface area of 0.63 mm$^2$.

The cell device in FIG. 6 includes a parallelepipedal unit 51, of aluminum for example, with a conical or pyramidal cavity 52 whose base forms the upper part of the unit and whose apex is located almost on the lower side. Cavity 52 is extended by a cylindrical hole 53 with a circular or square base which opens out at the lower side and has virtually the same surface area as the cell. A Fresnel lens 54 is located on the upper side of the unit, above the cavity. The lower section of cavity 52 and hole 53 are filled with the same material 55 as that comprising the antireflecting coating 10, the surface of the said material being shaped into the form of lens 56. The material 55 constitutes a light conduit.

An elemental cell 50 is bonded to the center of a thermal radiator 57 of anodized aluminium of copper and then unit 51 and radiator 57 are assembled for example by brazing in such a fashion that cell 50 is directly underneath hole 53. As an example, the unit has a 24×24 mm square cross-section and a surface area of 567 mm². Its height is 49 mm and the distance between lenses 54 and 56 is 40 mm. Insulated connections 58 pass through radiator 57 and terminate in pins 59.

The solar concentration provided by the optical system is 576/0.63≃900.

I claim:
1. A photovoltaic cell device comprising:
   a metal parallelepipedal unit;
   a tapering cavity inside said unit having a base coinciding with the upper end of the unit and an apex communicating with the lower end of the unit through a hole;
   a Fresnel lens on the base of the cavity;
   a transparent antireflecting insert member within said hole and the part of the cavity near the apex thereof, said insert member being terminated at its upper end by a lens shaped part; and
   against said hole a photovoltaic cell comprising a heterojunction between a first layer of $Ga_{1-x}Al_x$ As of p-type conductivity and a second layer of GaAs of n-type conductivity, x varying from 0 at the junction of the first and second layers to substantially 0.9 at the outer face of the first layer; a homojunction between a third layer of Ge of p-type conductivity and a fourth layer of Ge of n-type conductivity; and a tunnel diode formed by a heavily doped part of the second layer and a heavily doped part of the third layer which are in contact therebetween.

2. A photovoltaic cell device according to claim 2 further comprising a thermal bonded to said unit and to said cell.